United States Patent
Iwaki

(10) Patent No.: US 7,294,534 B2
(45) Date of Patent: Nov. 13, 2007

(54) INTERCONNECT LAYOUT METHOD

(75) Inventor: Takayuki Iwaki, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 203 days.

(21) Appl. No.: 11/244,137

(22) Filed: Oct. 6, 2005

(65) Prior Publication Data

US 2006/0084261 A1     Apr. 20, 2006

(30) Foreign Application Priority Data

Oct. 19, 2004   (JP)  .............................. 2004-304309

(51) Int. Cl.
*H01L 21/82* (2006.01)
(52) U.S. Cl. ...................... 438/129; 438/599
(58) Field of Classification Search ................ 438/128, 438/129, 598, 599, 622, 666, 669; 716/2, 716/8
See application file for complete search history.

(56) References Cited

U.S. PATENT DOCUMENTS

| | | | |
|---|---|---|---|
| 5,459,093 A * | 10/1995 | Kuroda et al. | 438/599 |
| 6,261,883 B1 * | 7/2001 | Koubuchi et al. | 438/598 |
| 6,413,847 B1 * | 7/2002 | Yeh et al. | 438/598 |
| 6,905,967 B1 * | 6/2005 | Tian et al. | 438/129 |
| 7,153,728 B2 * | 12/2006 | Morita | 438/129 |
| 2002/0179941 A1 * | 12/2002 | Ootake et al. | 438/128 |
| 2004/0152243 A1 * | 8/2004 | Kuroda et al. | 438/129 |

FOREIGN PATENT DOCUMENTS

| | | |
|---|---|---|
| JP | 09-311432 | 12/1997 |
| JP | 2000-112114 | 4/2002 |

* cited by examiner

*Primary Examiner*—Kevin M. Picardat
(74) *Attorney, Agent, or Firm*—Young & Thompson

(57) ABSTRACT

In an interconnect layout 100, the first gate pattern, the second gate pattern, the first dummy pattern, and the second dummy pattern are arranged so that, if a wavelength of a light used to expose the first gate pattern and the second gate pattern is $\lambda$, natural numbers are $m_1$, $m_2$, and $m_3$, the first predetermined distance is $P_1$, the second predetermined distance is $P_2$, the third predetermined distance is $P_3$, a design value of the first predetermined distance is $P_1'$, a design value of the second predetermined distance is $P_2'$, and a design value of the third predetermined distance is $P_3'$, then the first predetermined distance satisfies relationships of $P_1=m_1\lambda$ and $P_1'-0.1\lambda \leq P_1 \leq P_1'+0.1\lambda$, the second predetermined distance satisfies relationships of $P_2=m_2\lambda$ and $P_2'-0.1\lambda \leq P_2 \leq P_2'+0.1\lambda$, and the third predetermined distance satisfies relationships of $P_3=m_3\lambda$ and $P_3'-0.1\lambda \leq P_3 \leq P_3'+0.1\lambda$.

16 Claims, 3 Drawing Sheets

INTERCONNECT LAYOUT METHOD

This application is based on Japanese Patent application NO. 2004-304309, the content of which is incorporated hereinto by reference.

BACKGROUND OF THE INVENTION

1. Field of the Invention

The present invention relates to an interconnect layout method.

2. Related Art

Recently, following high integration and reduction in size of semiconductor devices, fluctuations in shape of gate patterns during forming the gate patterns has greatly influenced on fluctuations in electric characteristics such as an ON current and a threshold voltage. It is, therefore, required to provide a technique for controlling fluctuations in shape of the gate patterns so as to improve semiconductor device yield by improving the electric characteristics.

As shown in FIG. 4, in a conventional gate layout as disclosed in Japanese Laid-open patent publication No. 1997-311432 (No. H09-311432), a so-called vacant area 9 is present between actual patterns 8a to 8d and actual patterns 8e to 8h employed for interconnects. Due to this, the shape of the actual patterns arranged closer to the vacant area 9 are disadvantageously made thinner.

To solve this disadvantage and control the fluctuations in shape of the gate patterns, a technique for controlling fluctuations in gate length while making optical diffraction and microloading effects constant is disclosed in Japanese Laid-open patent publication No. 2000-112114.

FIG. 5 shows one example of a gate layout method using the technique disclosed in Japanese Laid-open patent publication No. 2000-112114.

In a gate layout 10 shown in FIG. 5, a dummy gate pattern 3 and a dummy gate pattern 4 which is equal in device structure to actual gates but which include no circuitry functions are provided to be separated from a gate pattern 1 and a gate pattern 2. Because of this, a smallest distance p between each gate pattern and each dummy gate pattern is substantially constant except for gate terminal portions and corner portions.

A gate length of each gate pattern is equal to or smaller than $0.5\lambda/NA$, center-to-center distances p between two adjacent patterns of the gate pattern 1 and the gate pattern 2 and the dummy gate pattern 3 and the dummy gate pattern 4 are equal to or smaller than $2\lambda/NA$, and a fluctuation width of the center-to-center distance p is within a range between −10% and +10% of the distance p.

SUMMARY OF THE INVENTION

If the conventional gate layout method disclosed in Japanese Laid-open patent publication No. 2000-112114 is used, dimensional differences among various gate patterns within one exposure shot can be reduced. However, this effect is limited to a step for forming gates and no consideration is given to fluctuations in shape of the gate patterns that repeatedly occur by repetition of optical shot into a silicon wafer. In addition, even if patterns are equal in shape, the semiconductor device yield is not improved yet in the conventional gate layout method for repeatedly performing exposure shots into the silicon wafer a number of times.

According to the present invention, there is provided an interconnect layout method for arranging: a first gate pattern and a second gate pattern provided substantially in parallel to each other at a first predetermined distance between the first gate pattern and the second gate pattern; a first dummy pattern that is provided adjacent to the first gate pattern on an opposite side to a side on which the second gate pattern is provided, at a second predetermined distance from the first gate pattern in a direction substantially in parallel to a longitudinal direction of the first gate pattern, and that includes no circuitry functions; and a second dummy pattern that is provided adjacent to the second gate pattern on an opposite side to a side on which the first gate pattern is provided, at a third predetermined distance from the second gate pattern in a direction substantially in parallel to a longitudinal direction of the second gate pattern, and that includes no circuitry functions, wherein the first gate pattern, the second gate pattern, the first dummy pattern, and the second dummy pattern are arranged so that, if a wavelength of a light used to expose the first gate pattern and the second gate pattern is $\lambda$, natural numbers are $m_1$, $m_2$, and $m_3$, the first predetermined distance is $P_1$, the second predetermined distance is $P_2$, the third predetermined distance is $P_3$, a design value of the first predetermined distance is $P_1'$, a design value of the second predetermined distance is $P_2'$, and a design value of the third predetermined distance is $P_3'$, then the first predetermined distance satisfies a relationships of $P_1=m_1\lambda$ and $P_1'-0.1\lambda \leq P_1 \leq P_1'+0.1\lambda$, the second predetermined distance satisfies relationships of $P_2=m_2\lambda$ and $P_2'-0.1\lambda \leq P_2 \leq P_2'+0.1\lambda$, and the third predetermined distance satisfies relationships of $P_3=m_3\lambda$ and $P_3'-0.1\lambda \leq P_3 \leq P_3'+0.1\lambda$.

According to the present invention, the gate patterns and the dummy patterns are arranged so that the first predetermined distance, the second predetermined distance, and the third predetermined distance are the numeric value that is within the range from −10% to +10% of the exposure wavelength $\lambda$ while centering around the numeric value that is a natural number multiple of the wavelength of the light ("exposure light") used for exposure of the gate patterns. A diffracted light of the exposure light is, therefore, reduced and the fluctuations of imaging are reduced. Thus, fluctuations in the shape of the gate patterns which occur by repetition of the exposure shots may be reduced. As a result of this, the semiconductor device yield may be improved.

According to the present invention, the first predetermined distance, the second predetermined distance, and the third predetermined distance are the numeric value that falls within the range from −10% to +10% of the exposure wavelength $\lambda$ and that centers around the numeric value that is a natural number multiple of the wavelength of the light used for exposure of the gate patterns. It is, therefore, possible to reduce the fluctuations in shape of the gate patterns and improve the semiconductor device yield.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

An exemplary embodiment of the present invention will be described hereinafter with reference to the drawings. Like constituent elements are denoted by the same reference symbols throughout the drawings, and they will not be repeatedly described.

Figure 1:
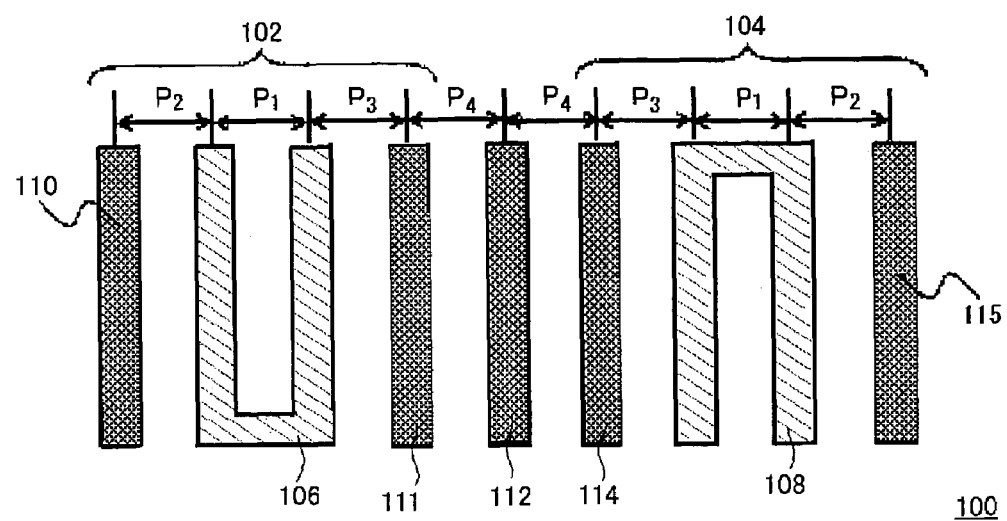
FIG. 1 is a schematic plan view that shows an interconnect layout according to an embodiment of the present invention.

In an interconnect layout 100 shown in FIG. 1, a first gate pattern and a second gate pattern provided substantially in parallel to each other at a first predetermined distance therebetween, a first dummy pattern (dummy interconnect 110) that is provided to be adjacent to the first gate pattern on an opposite side to a side on which the second gate pattern is provided at a second predetermined distance from the first gate pattern, in a direction substantially in parallel to a longitudinal direction of the first gate pattern, and that includes no circuitry functions. In addition, a second dummy pattern (dummy interconnect 111) that is provided to be adjacent to the second gate pattern on an opposite side to the side on which the first gate pattern is provided at a third predetermined distance from the second gate pattern, in a direction substantially in parallel to a longitudinal direction of the second gate pattern, and that includes no circuitry functions are arranged.

In the interconnect layout 100 shown in FIG. 1, the first gate pattern, the second gate pattern, the first dummy pattern, and the second dummy pattern are arranged so that, if a wavelength of a light used to expose the first gate pattern and the second gate pattern is $\lambda$, natural numbers are $m_1$, $m_2$, and $m_3$, the first predetermined distance is $P_1$, the second predetermined distance is $P_2$, the third predetermined distance is $P_3$, a design value of the first predetermined distance is $P_1'$, a design value of the second predetermined distance is $P_2'$, and a design value of the third predetermined distance is $P_3'$, then the first predetermined distance satisfies relationships of $P_1=m_1\lambda$ and $P_1'-0.1\lambda \leq P_1 \leq P_1'+0.1\lambda$ the second predetermined distance satisfies relationships of $P_2=m_2\lambda$ and $P_2'-0.1\lambda \leq P_2 \leq P_2'+0.1\lambda$ and the third predetermined distance satisfies relationships of $P_3=m_3\lambda$ and $P_3'-0.1\lambda \leq P_3 \leq P_3'+0.1\lambda$.

FIG. 1 is a plan view for describing the interconnect layout 100 of a transistor according to the embodiment of the present invention.

The interconnect layout 100 includes a block 102 and a block 104, and a dummy interconnect 112 serving as a third dummy pattern. In the present embodiment, the block 102 and the block 104 have characteristic that they are not electrically connected to each other and are not equal in potential.

The block 102 includes a designed interconnect 106, the dummy interconnect 110 serving as the first dummy pattern, and the dummy interconnect 111 serving as the second dummy pattern.

The block 104 includes a designed interconnect 108, a dummy interconnect 114 serving as a second dummy pattern, and a dummy interconnect 115 serving as a first dummy pattern.

In FIG. 1, it is assumed that a part of the designed interconnect 106 located at the left side of a notch portion of the designed interconnect 106 and a part of the designed interconnect 108 located at the right side of a notch portion of the designed interconnect 108 (that is, parts of the designed interconnect 106 and the designed interconnect 108 located outside the notch portions thereof in FIG. 1) are first gate patterns, respectively. It is also assumed that a part of the designed interconnect 106 located at the right side of a notch portion of the designed interconnect 106 and a part of the designed interconnect 108 located at the left side of a notch portion of the designed interconnect 108 (that is, parts of the designed interconnect 106 and the designed interconnect 108 located inside the notch portions thereof in FIG. 1) are second gate patterns, respectively. The designed interconnect 106, therefore, includes the first gate pattern and the second gate pattern. In addition, The designed interconnect 108 includes the first gate pattern and the second gate pattern. The first gate patterns are arranged substantially in parallel to the second gate patterns.

In the present embodiment, the designed interconnect 106 is of a U-shape that has the notch open upward, and the designed interconnect 108 is of an inverted-U-shape that has the notch open downward in FIG. 1.

In FIG. 1, the dummy interconnect 110 is arranged at the left side of the designed interconnect 106, that is, on the opposite side to the side on which the second gate pattern is provided in the direction substantially in parallel to the longitudinal direction of the first gate pattern. The dummy interconnect 111 is arranged at the right side of the designed interconnect 106, that is, on the opposite side to the side on which the first gate pattern is provided in the direction substantially in parallel to the longitudinal direction of the second gate pattern.

The dummy interconnect 114 is arranged at the left side of the designed interconnect 108, that is, on the opposite side to the side on which the first gate pattern is provided in the direction substantially in parallel to the longitudinal direction of the second gate pattern. The dummy interconnect 115 is arranged at the right side of the designed interconnect 108, that is, on the opposite side to the side on the second gate pattern is provided in the direction substantially in parallel to the longitudinal direction of the first gate pattern. In this specification, "substantially in parallel" means that a margin within a range in which advantages of this embodiment are exhibited is allowed when each interconnect is arranged.

In FIG. 1, the dummy interconnect 112 is arranged at the right side of the dummy interconnect 111 and at the left side of the dummy interconnect 114, that is, arranged between the block 102 and the block 104 in the direction substantially in parallel to the longitudinal direction of the first gate pattern and to the longitudinal direction of the dummy interconnect 111.

The dummy interconnects 111, 112, 114, and 115 do not include circuitry functions. Further, in the present embodiment, a length of each dummy interconnect in the longitudinal direction is equal to that of the designed interconnect 106 and the designed interconnect 108 in the longitudinal direction.

In the present embodiment, in FIG. 1, the center-to-center distance $P_1$ of the designed interconnect 106 and the center-to-center distance $P_1$ of the designed interconnect 108, which distance is referred to as "the first predetermined distance" are 0.38 μm. The center-to-center distance $P_2$ between the first gate pattern located at the left side of the notch portion of the designed interconnect 106 and the dummy interconnect 110, which distance is referred to as "the second predetermined distance" and the center-to-center distance $P_3$ between the second gate pattern located at the right side of the notch portion of the designed interconnect 106 and the dummy interconnect 111, which distance is referred to as "the third predetermined distance", and the center-to-center distance $P_2$ between the first gate pattern located at the right side of the notch portion of the designed interconnect 108 and the dummy interconnect 115, which distance is referred to as "the second predetermined distance" and the center-to-center distance $P_3$ between the second gate pattern located at the left side of the notch portion of the designed interconnect 108 and the dummy interconnect 115, which distance is referred to as "the third predetermined distance" are 0.38 μm. A center-to-center distance $P_4$ between the dummy interconnect 111 and the dummy interconnect 112 and the center-to-center distance $P_4$ between the dummy interconnect 112 and the dummy interconnect 114 are 0.38 μm. Namely, the gate patterns and the dummy interconnects are arranged so that the center-to-center distances $P_1$, $P_2$, $P_3$, and $P_4$ are all equal and 0.38 μm. The center-to-center distance $P_1$ of the designed interconnect 106 and that of the designed interconnect 108 means a distance between a centerline of the part of the designed interconnect located outside the notch portion thereof serving as the first gate pattern and a centerline of the part of the designed interconnect located inside the notch portion thereof serving as the second gate pattern.

In the present embodiment, the interconnect layout 100 is exposed to a light using an ArF light source as a laser light source in a photoresist step.

An exposure wavelength λ of the ArF light is about 193 nanometers. The center-to-center distance ($P_1$) of the designed interconnect 106 and of the designed interconnect 108 is 0.38 μm. Accordingly, the designed interconnect 106 and the designed interconnect 108 are arranged so that a numeric value of $P_1$ is within a range from −5% to +5% of the exposure wavelength λ while centering around a numeric value that is a natural number multiple of the exposure wavelength, which is "$P_1'$".

Further, for the dummy interconnect 110 and the dummy interconnect 111, and the dummy interconnect 114 and the dummy interconnect 115 provided adjacent to the designed interconnect 106 and the designed interconnect 108, respectively, the center-to-center distances ($P_2$ and $P_3$) between the respective dummy interconnects and the designed interconnects are equal to $P_1$ (0.38 μm). Accordingly, the dummy interconnects 110, 111, 114, and 115 are arranged so that numeric values of $P_2$ and $P_3$ are within the range from −5% to +5% of the exposure wavelength λ while centering around the numeric value of a natural number multiple of the exposure wavelength, which is "$P_2'$ and $P_3'$".

Further, for the dummy interconnect 114 provided between the block 102 and the block 104, the center-to-center distances ($P_4$) between the dummy interconnect 111 or the dummy interconnect 114 are equal to $P_1$, $P_2$, $P_3$ (0.38 μm). Accordingly, the dummy interconnects 114 is arranged so that numeric values of $P_4$ is within the range from −5% to +5% of the exposure wavelength λ while centering around the numeric value of a natural number multiple of the exposure wavelength, which is "$P_4'$".

Figure 2:
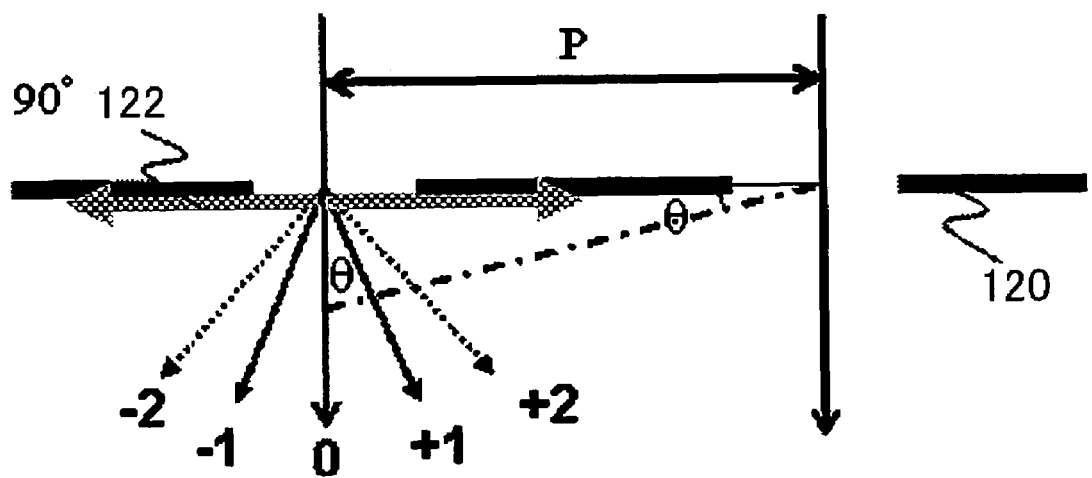
FIG. 2 shows the principle of the interconnect layout according to the embodiment.

FIG. 2 shows the principle of an optical diffraction effect generated when the laser light used for the exposure is incident on a reticle 120. In FIG. 2, "−2 to +2" indicates that an $n^{th}$ order diffracted light advances in two directions with an extension of the incident light on the reticle 120 set as a centerline.

Optical diffraction can be expressed by converting a pattern periodicity into a diffracted light periodicity as shown in the following Equation.

Sinq=mλ/P (where m is a natural number, λ shows the exposure wavelength, P shows the center-to-center distance between the patterns, and q shows a diffraction angle).

If the center-to-center distance P is 0.38 μm, a secondary diffracted light 122 at m=2 is very close to 90 degrees as much as possible and deviated from a projection optical system. As can be seen, if the center-to-center distance between the patterns is set to the numeric value that is a natural number multiple of the exposure wavelength, the diffracted light is reduced. It is, therefore, considered that an angle distribution of the diffracted light is made small and a fluctuation in imaging can be reduced. As a result, fluctuations in shape of the gate patterns generated by repetition of exposure shots can be reduced.

Figure 3:
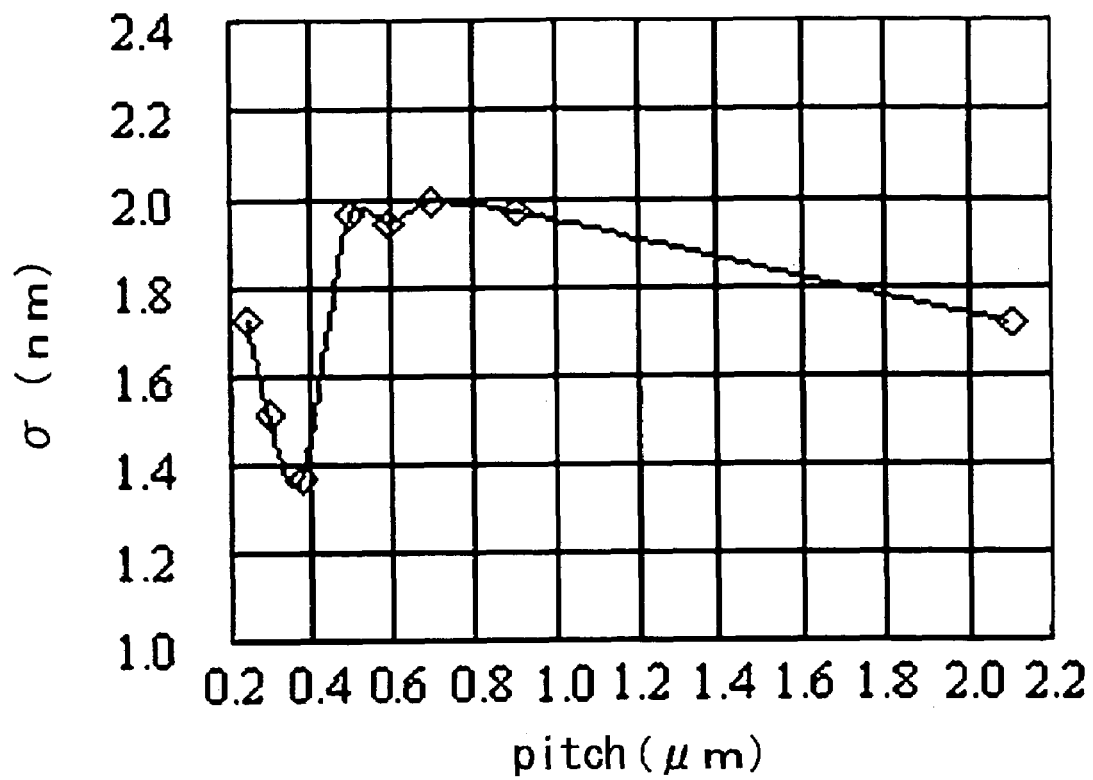
FIG. 3 is a graph that shows a result of using the interconnect layout according to the embodiment.
Figure 4:
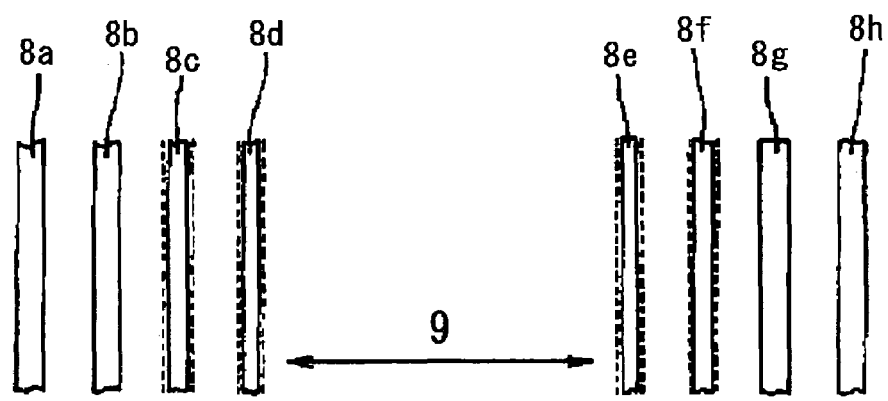
FIG. 4 is a schematic plan view that shows an interconnect layout according to a conventional technique.
Figure 5:
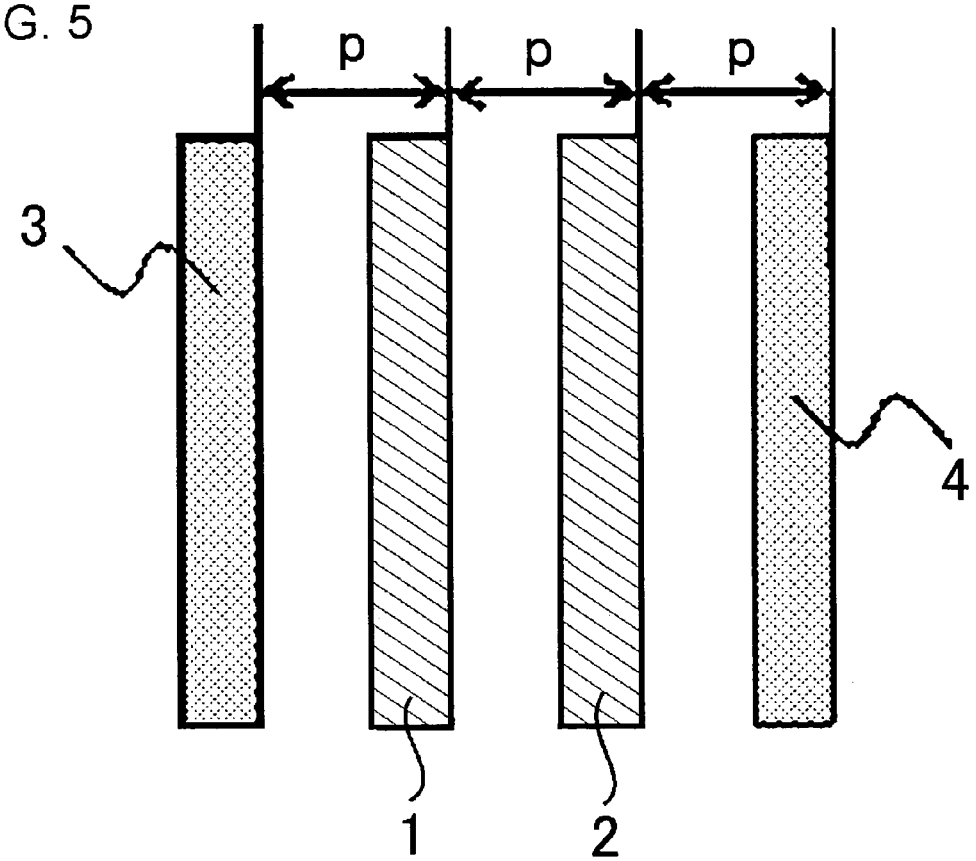
FIG. 5 is a schematic plan view that shows an interconnect layout according to a conventional technique.

FIG. 3 shows fluctuations (σ) generated by repetition of 44 shots at the center-to-center distance (pitch) of the resist pattern formed using the ArF light (λ=193 nanometers). The fluctuations are the smallest near 0.38 μm that is within 5% of the exposure wavelength and that centers around the center-to-center distance which is twice as large as the exposure wavelength. If a light intensity distribution is considered, a big reduction effect of fluctuations is obtained if the "m" is set as small as possible. This is because, the smaller "m" is, the higher the intensity of the light is and the exposure depends on the diffracted light at high intensity more greatly. If "m" is equal to or smaller than 2, in particular, the big reduction effect of fluctuations is obtained.

To set the center-to-center distance between one gate pattern and one dummy interconnect constant, the dummy interconnect patterns need to be arranged substantially in parallel to the designed interconnects.

Hereinafter, the advantages of the interconnect layout 100 will be described.

In the conventional technique disclosed in Japanese Laid-open patent publication No.2000-112114, the fluctuation width of the center-to-center distance between each gate pattern and each dummy gate pattern is within the range from −10% to +10% of the center-to-center distance. In the present embodiment, on the contrary, the center-to-center distance $P_1$ between the gate patterns, and the center-to-center distances $P_2$ and $P_3$ between the gate patterns and the dummy interconnects are equally 0.38 μm. The gate patterns and the dummy interconnects are arranged so that the center-to-center distances are within the range from −5% and +5% of the exposure wavelength λ while centering around the numeric value that is a natural number multiple of the wavelength λ of the ArF light used as the laser light during the exposure. Namely, according to the conventional technique, the fluctuation width of 10% is specified based on the center-to-center distance. By contrast, according to this embodiment, the fluctuation width is specified based on the exposure wavelength λ. Since the exposure wavelength is smaller than the center-to-center distance, the fluctuation width of the center-to-center distance according to the present embodiment is smaller than the fluctuation width according to the conventional technique. Also, according to the conventional technique, since the fluctuation width is specified based on the center-to-center distance, the fluctuation width depends on the center-to-center distance and it is, therefore, difficult to accurately specify the fluctuation width. According to the present embodiment, by contrast, since the exposure wavelength λ has no change as long as the laser light source is same, the fluctuation width can be specified more accurately. It is, therefore, possible to more accurately make the angle distribution of the diffracted light smaller and further reduce the fluctuation in imaging. Accordingly, the fluctuations in shape of the gate patterns generated by the repetition of the exposure shots can be reduced further greatly.

In addition, in the present embodiment, the fluctuation width of the center-to-center distance is specified based on the exposure wavelength λ. It is, therefore, possible to apply the layout method according to the present embodiment to some exposure apparatus that irradiate any wavelength.

Moreover, in the present embodiment, the dummy interconnect 112 and the dummy interconnect 111 and the dummy interconnect 112 and the dummy interconnect 114 are arranged so that the center-to-center distances $P_4$ therebetween are equally 0.38 μm similarly to $P_1$, $P_2$, and $P_3$. Because of this, a width of fluctuations in shape of the dummy interconnects due to the exposure shots is substantially equal to that of fluctuations in shape of the designed interconnects. Accordingly, it is possible to further reduce the shape fluctuations on end portions of the designed interconnect 106 and the designed interconnect 108 in their longitudinal directions.

The embodiment of the present invention has been described so far with reference to the drawings. This embodiment is given only for exemplary illustration of the present invention and various other embodiments can be adopted.

For example, in the present embodiment, the instance in which the ArF light (at a wavelength of about 193 nanometers) is used as the laser light has been described. A laser light such as KrF (at a wavelength of about 248 nanometers) or an i-ray (at a wavelength of about 365 nanometers) larger in wavelength than the ArF light or a laser light such as $F_2$ (at a wavelength of 157 nanometers) smaller in wavelength than the ArF light may be used as long as the laser light is available in the photoresist step. As the wavelength of the light source used as the laser light is smaller, the fluctuation width is smaller. It is, therefore, possible to further reduce the fluctuations in shape of the gate patterns. Namely, the laser light is preferably $F_2$, ArF, KrF, or i-ray having the wavelength of which is equal to or smaller than 400 nanometers, and more preferably $F_2$ or ArF having the wavelength of which is equal to or smaller than 200 nanometers.

Also, in the present embodiment, the instance in which the center-to-center distances $P_1$, $P_2$, $P_3$, $P_4$ and the like are equally 0.38 μm has been described. As long as the numeric value of the center-to-center distance is within the range from −10% to +10% of the numeric value that is a natural number multiple of the exposure wavelength λ, it is possible to reduce the fluctuations in shape of the gate patterns. If the fluctuation width of the center-to-center distance is within the range from −5% to +5% of the exposure wavelength λ, it is possible to further reduce the fluctuations in shape of the gate patterns.

Further, in the present embodiment, the instance in which one designed interconnect is present in each block has been described. Alternatively, two or more designed interconnects may be present in each block. In addition, two or more dummy interconnects may be present on each side of each designed interconnect.

In addition, in the present embodiment, the instance in which the designed interconnect 106 is arranged into the U-shape, the designed interconnect 108 is arranged into the inverted U-shape, and each of the designed interconnect 106 and the designed interconnect 108 is formed integrally has been described. Alternatively, each of the designed interconnects may be configured by two or more interconnects provided substantially in parallel. In this case, the designed interconnects are assumed to be electrically connected to one another on the other layer within the transistor.

Moreover, in the present embodiment, the instance in which one dummy interconnect 112 is held between the block 102 and the block 104 has been described. Alternatively, two or more dummy interconnects may be held between the blocks. In addition, a configuration in which no dummy interconnect is held between the block 102 and the block 104 and in which only dummy interconnects are arranged in the respective blocks may be effectively used.

Furthermore, in the present embodiment, the interconnect layout method for the transistor has been described. Alternatively, the interconnect layout method described in this embodiment may be applied to a semiconductor device other than the transistor.

It is apparent that the present invention is not limited to the above embodiment, that may be modified and changed without departing from the scope and spirit of the invention.

What is claimed is:

1. An interconnect layout method for arranging:
    a first gate pattern and a second gate pattern provided substantially in parallel to each other at a first predetermined distance between said first gate pattern and said second gate pattern;
    a first dummy pattern that is provided adjacent to said first gate pattern on an opposite side to a side on which said second gate pattern is provided, at a second predetermined distance from said first gate pattern in a direction substantially in parallel to a longitudinal direction of said first gate pattern, and that includes no circuitry functions; and
    a second dummy pattern that is provided adjacent to said second gate pattern on an opposite side to a side on which said first gate pattern is provided, at a third predetermined distance from said second gate pattern in a direction substantially in parallel to a longitudinal direction of said second gate pattern, and that includes no circuitry functions, wherein
    said first gate pattern, said second gate pattern, said first dummy pattern, and said second dummy pattern are arranged so that, if a wavelength of a light used to expose said first gate pattern and said second gate pattern is λ, natural numbers are $m_1$, $m_2$, and $m_3$, the first predetermined distance is $P_1$, the second predetermined distance is $P_2$, the third predetermined distance is $P_3$, a design value of the first predetermined distance is $P_1'$, a design value of the second predetermined distance is $P_2'$, and a design value of the third predetermined distance is $P_3'$, then said first predetermined distance satisfies a relationships of:

$P_1 = m_1 \lambda$ $P_1' - 0.1\lambda \leq P_1 \leq P_1' + 0.1\lambda$, said second predetermined distance satisfies relationships of:

$P_2 = m_2 \lambda$ $P_2' - 0.1\lambda \leq P_2 \leq P_2' + 0.1\lambda$, and
    said third predetermined distance satisfies relationships of:

$P_3 = m_3 \lambda$ $P_3' - 0.1\lambda \leq P_3 \leq P_3' + 0.1\lambda$.

2. The layout method according to claim 1, wherein said first gate pattern is electrically connected to said second gate pattern.

3. The layout method according to claim 1, wherein a relationship of $P_1' - 0.05\lambda \leq P_1 \leq P_1' + 0.05\lambda$ is satisfied.

4. The layout method according to claim 1, wherein a relationship of $P_2'-0.05\lambda \leq P_2 \leq P_2'+0.05\lambda$ is satisfied.

5. The layout method according to claim 1, wherein a relationship of $P_3'-0.05\lambda \leq P_3 \leq P_3'+0.05\lambda$ is satisfied.

6. The layout method according to claim 1, wherein a relationship of $P_1=P_2=P_3$ is satisfied.

7. The layout method according to claim 1, wherein said $m_1$, said $m_2$, and said $m_3$ are equal to or smaller than 2.

8. The layout method according to claim 1, wherein
a plurality of blocks each configured by said first gate pattern, said second gate pattern, said first dummy pattern adjacent to said first gate pattern, and said second dummy pattern adjacent to said second gate pattern are arranged,
a third dummy pattern that is provided substantially in parallel to the longitudinal direction of said first gate pattern that constitutes each of said blocks, and that includes no circuitry functions is arranged between said plurality of blocks at a fourth predetermined distance from the each block, and
if said fourth predetermined distance is $P_4$ and a design value of said fourth predetermined distance is $P_4'$, and a natural number is $m_4$, relationships of:

$P_4 = m_4 \lambda$ $P_4'-0.1\lambda \leq P_4 \leq P_4'+0.1\lambda$.

is satisfied.

9. The layout method according to claim 8, wherein a relationship of $P_4'-0.05\lambda \leq P_4 \leq P_4'+0.05\lambda$ is satisfied.

10. The layout method according to claim 8, wherein said plurality of blocks are not electrically connected to one another.

11. The layout method according to claim 8, wherein a relationship of $P_1=P_2=P_3=P_4$ is satisfied.

12. The layout method according to claim 8, wherein said $m_4$ is equal to or smaller than 2.

13. The layout method according to claim 1, wherein a wavelength of a light used for exposure of said first gate pattern and said second gate pattern is equal to or smaller than 400 nanometers.

14. The layout method according to claim 8, wherein a wavelength of a light used for exposure of said first gate pattern and said second gate pattern is equal to or smaller than 400 nanometers.

15. The layout method according to claim 1, wherein a light source of a light used for exposure of said first gate pattern and said second gate pattern is one selected from a group consisting of $F_2$, ArF, KrF, and an i-ray.

16. The layout method according to claim 8, wherein a light source of a light used for exposure of said first gate pattern and said second gate pattern is one selected from a group consisting of $F_2$, ArF, KrF, and an i-ray.

* * * * *